(12) United States Patent
Pennam et al.

(10) Patent No.: US 11,677,234 B2
(45) Date of Patent: Jun. 13, 2023

(54) POWER INPUT SOURCE DETECTION IN AIRCRAFT LRU

(71) Applicant: Hamilton Sundstrand Corporation, Charlotte, NC (US)

(72) Inventors: Hemanth Kumar Pennam, Andhra Pradesh (IN); Alagan Thiruvarul Selvakkumaran Sathyan, Tamilnadu (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/502,088

(22) Filed: Oct. 15, 2021

(65) Prior Publication Data
US 2023/0058478 A1    Feb. 23, 2023

(30) Foreign Application Priority Data
Aug. 20, 2021  (IN) .............. 202111037788

(51) Int. Cl.
*H02H 9/02* (2006.01)
*B64F 5/60* (2017.01)
*H02H 1/00* (2006.01)
*H02J 7/00* (2006.01)
*H03K 17/082* (2006.01)
*H02H 9/04* (2006.01)

(52) U.S. Cl.
CPC .............. *H02H 9/025* (2013.01); *B64F 5/60* (2017.01); *H02H 1/0007* (2013.01); *H02H 9/045* (2013.01); *H02J 7/00304* (2020.01); *H03K 17/0822* (2013.01)

(58) Field of Classification Search
CPC .................... H02H 9/025; B64F 5/60
See application file for complete search history.

(56) References Cited

U.S. PATENT DOCUMENTS

| 5,319,536 A | 6/1994 | Malik |
| 9,660,446 B2 | 5/2017 | Toothman et al. |
| 10,090,676 B2 | 10/2018 | Knowles et al. |
| 10,340,679 B2 | 7/2019 | Jouper |

(Continued)

FOREIGN PATENT DOCUMENTS

CN    106371544 A    2/2017

OTHER PUBLICATIONS

European Search Report for Application No. 22189536.0, dated Jan. 4, 2023, 8 pages.

*Primary Examiner* — Jared Fureman
*Assistant Examiner* — Christopher J Clark
(74) *Attorney, Agent, or Firm* — Cantor Colburn LLP

(57) ABSTRACT

Provided are embodiments for a system for performing input power detection. The system includes a first input for a first power source, a second input for a second power source, and a controller that is operably coupled to the first power source and the second power source. The system also includes a first path connecting a first circuit to the first power supply, wherein the first path comprises a first field effect transistor (FET) that is operated to inhibit leakage current flow to the first circuit, and a second path connecting a second circuit to the second power supply, wherein the second path comprises a second FET that is operated to inhibit leakage current flow to the second circuit. Also provided are embodiments for a method for performing input power detection.

14 Claims, 3 Drawing Sheets

(56) References Cited

U.S. PATENT DOCUMENTS

| | | |
|---|---|---|
| 2004/0017642 A1 | 1/2004 | Alappat |
| 2004/0051384 A1 | 3/2004 | Jackson et al. |
| 2005/0127882 A1 | 6/2005 | Pan et al. |
| 2005/0185352 A1* | 8/2005 | Nguyen .................. H02J 9/061 |
| | | 361/90 |
| 2008/0303353 A1* | 12/2008 | Yu ............................ H02J 3/14 |
| | | 307/131 |
| 2013/0175868 A1* | 7/2013 | Taurand .................... H02J 9/06 |
| | | 307/80 |
| 2014/0054968 A1 | 2/2014 | Szu |

\* cited by examiner

POWER INPUT SOURCE DETECTION IN AIRCRAFT LRU

CROSS-REFERENCE TO RELATED APPLICATIONS

This application claims the benefit of Indian Application No. 202111037788 filed Aug. 20, 2021, the disclosure of which is incorporated herein by reference in its entirety.

BACKGROUND

The present invention relates to power management for multi-input power system, and more specifically, to improved power input source detection in aircraft line replaceable units (LRU).

The supply and distribution of electrical power to various loads relies upon numerous arrangements to accomplish that end. The electrical power supply sources can include generators and/or stored energy in batteries. Some systems may include multiple power supply sources for managing its load or for a redundant architecture. However, in an effort to increase the reliability of the system there may be a need to ensure that at least one or more power supply sources are available for use.

BRIEF DESCRIPTION

According to an embodiment, a system for performing input power detection is provided. The system can include a first input for a first power source, a second input for a second power source, and a controller operably coupled to the first power source and the second power source. The system can also include a first path connecting a first circuit to the first power supply, wherein the first path comprises a first field effect transistor (FET) that is operated to inhibit leakage current flow to the first circuit, and a second path connecting a second circuit to the second power supply, wherein the second path comprises a second FET that is operated to inhibit leakage current flow to the second circuit.

In addition to one or more of the features described herein, or as an alternative, further embodiments include using a first circuit and a second circuit that are configured to detect an availability of the first power source and the second power source, respectively.

In addition to one or more of the features described herein, or as an alternative, further embodiments include using a first power source that is 3-phase AC generator, and a second power source that is a battery source.

In addition to one or more of the features described herein, or as an alternative, further embodiments include a leakage current that is received at the first FET when the first power source is OFF and the second power source is ON.

In addition to one or more of the features described herein, or as an alternative, further embodiments include a leakage current that is received at the second FET when the second power source is OFF and the first power source is ON.

In addition to one or more of the features described herein, or as an alternative, further embodiments include using a controller that is coupled to the first power source and the second power source using an OR'ed diode configuration.

In addition to one or more of the features described herein, or as an alternative, further embodiments include a first FET and a second FET that are arranged as high-side switches.

In addition to one or more of the features described herein, or as an alternative, further embodiments include a first FET and a second FET that provide overvoltage protection.

According to an embodiment, a method for performing input power detection is provided. The method can include providing a first power supply, providing a second power supply, and coupling a controller to the first power source and the second power source. The method also includes connecting a first circuit to the first power supply over a first path, wherein the first path comprises a first field effect transistor (FET) that is operated to inhibit leakage current flow to the first circuit, and connecting a second circuit to the second power supply over a second path, wherein the second path comprises a second FET that is operated to inhibit leakage current flow to the second circuit.

In addition to one or more of the features described herein, or as an alternative, further embodiments include a first circuit and a second circuit that are configured to detect an availability of the first power source and the second power source, respectively.

In addition to one or more of the features described herein, or as an alternative, further embodiments include a first power source that is 3-phase AC generator, and a second power source that is a battery source.

In addition to one or more of the features described herein, or as an alternative, further embodiments include receiving a leakage current at the first FET when the first power source is OFF and the second power source is ON.

In addition to one or more of the features described herein, or as an alternative, further embodiments include receiving a leakage current at the second FET when the second power source is OFF and the first power source is ON.

In addition to one or more of the features described herein, or as an alternative, further embodiments include coupling a first power source and a second power source to the controller using an OR'ed diode configuration.

In addition to one or more of the features described herein, or as an alternative, further embodiments include a first FET and a second FET that are arranged as high-side switches.

In addition to one or more of the features described herein, or as an alternative, further embodiments include a first FET and a second FET that provide overvoltage protection.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

In today's environment, aircraft are often equipped with multiple power sources includes generators and stored energy sources include batteries. The aircraft pilot and systems must have the correct information indicating a status one or more power supplies in order to carry out specific tasks for the aircraft. Existing configurations for the power distribution system rely on an OR'ed configuration of diodes to manage any leakage current that may be present between the power supplies. However, it is known that diodes can still allow leakage current to flow to the power supply detection units which may register false readings. As a result, the pilot and/or system may attempt to perform a task without having the correct information for the available power supplies caused by the leakage current. The techniques described herein, increase the reliability of the power supply detection for aircraft and other systems.

Figure 1:
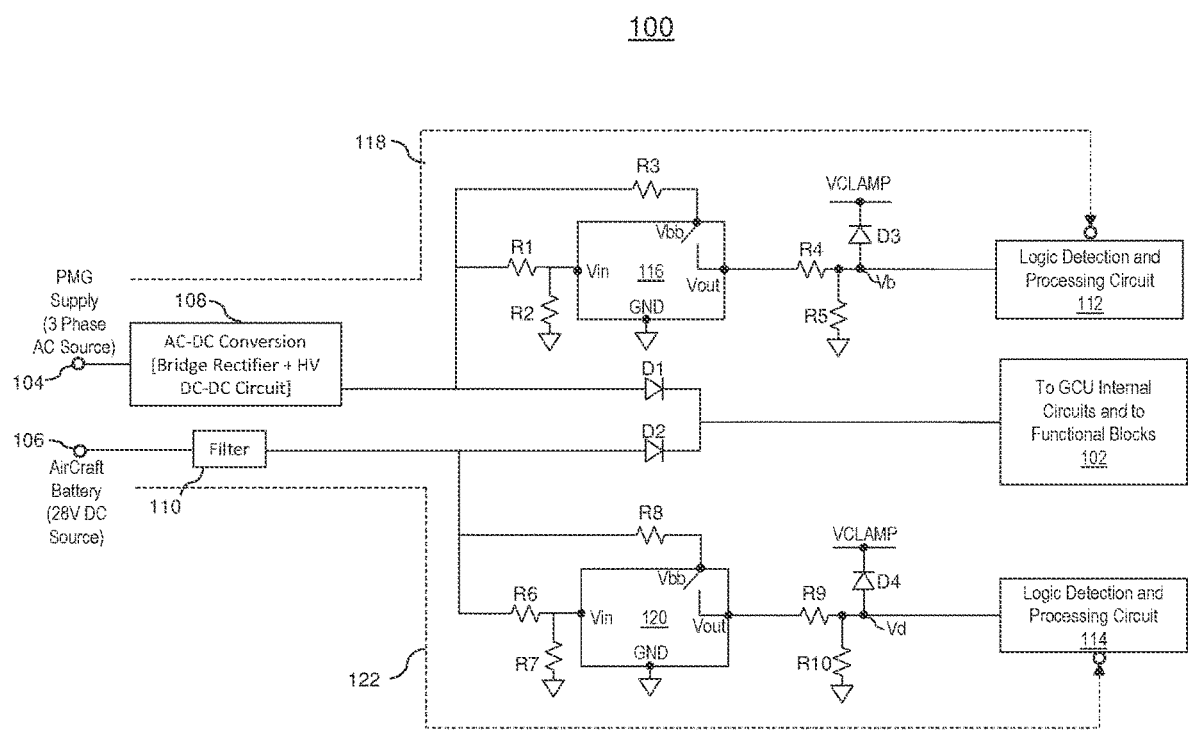
FIG. 1 depicts a system for power input source detection in accordance with one or more embodiments of the disclosure.

FIG. 1 a system 100 for input power detection in accordance with one or more embodiments of the disclosure. The system 100 includes a controller 102. A non-limiting example of the controller 102 can include a generator control unit (GCU) for controller the operation of a generator (not shown) used on an aircraft. The controller 102 can receive power from a first power supply 104 (i.e., permanent magnet generator supply) and/or a second power supply 106 (i.e., aircraft battery). The first power supply 104 can provide a 3-phase alternating current (AC) to an AC-DC converter 108 to produce direct current (DC) to power the controller 102. The second power supply 106 can provide DC to a filter 110 to remove any distortion in the DC to power the controller 102. Although only 2 input power sources are discussed with reference to FIG. 1, it can be appreciated that different types of power sources and a different number of power sources can be used and is not limited by the components shown in the system 100.

FIG. 1 also depicts a first logic and detection processing circuit (hereinafter referred to as "first circuit 112") and a second logic and detection processing circuit (hereinafter referred to as "second circuit 114"). The first circuit 112 and the second circuit 114 are configured to detect the available input power source. In a non-limiting example, a logic HI signal at the first circuit 112 or second circuit 114 can indicate that the first power supply 104 and the second power supply 106, respectively, are available. Alternatively, a logic LO signal can indicate the first power supply 104 and the second power supply 106, respectively, are unavailable. Leakage current of a sufficient magnitude can provide false indications for the availability of the first power supply 104 or the second power supply 106.

In one or more embodiments of the disclosure, the first circuit 112 receives power from the first power supply 104 for operation, and the second circuit 114 received power from the second power supply 106 for operation. The first circuit 112 and the second circuit 114 can each be operated independently in the ON and OFF states. For example, the first power supply 104 can supply power to the first circuit 112 while the second power supply 106 is not providing power to the second circuit 114. Alternatively, the first power supply 104 may not be providing power to the first circuit 112 while the second power supply 106 is providing power to the second circuit 114. It should be understood that the first power supply 104 and the second power supply 106 can be simultaneously operated to supply power and/or not supply power to the system 100.

FIG. 1 depicts a first diode D1 positioned between the first power supply 104 and the controller 102 and a second diode D2 positioned between the second power supply 106 and the controller 102. The diodes D1, D2 can include Schottky diodes or any other type of diode that is suitable for current control. In a scenario when the first power supply 104 is supplying power ("ON") and the second power supply 106 is not ("OFF"), a leakage current may be allowed to flow from the first power supply 104 through the first diode D1 and second diode D2 to the second circuit 114. This can incorrectly provide an indication to the second circuit 114 that the second power supply 106 is currently supplying power ("ON"), when in fact, the second power supply is OFF. Similarly, in a scenario when the second power supply 106 is supplying power ("ON") and the first power supply 104 is not ("OFF"), a leakage current may be allowed to flow from the second power supply 106 through the second diode D2 and first diode D1 to the first circuit 112. This can incorrectly provide an indication to the first circuit 112 that the first power supply 106 is currently supplying power ("ON"), when in fact, the first power supply 106 is OFF.

To ensure the leakage current does not provide a false indication to the first circuit 112 that the first power supply 104 is ON, a first field effect transistor (FET) 116 is included on the first path 118 which provides power from the first power supply 104 to the first circuit 112. The FET 116 is operated as a high-side switch and is operated to bypass the diode leakage current circuit (input side) and first circuit 112.

A divider circuit including resistors R1, R2 is coupled to the input (Vin) of the FET 116 to counter any diode leakage current. The resistor R1 functions as a current limiting resistor. Also, resistor R3 can be selected to aid in limiting the leakage current flow into the Vbb of the FET 116. The selection of resistor R3 aids in limiting the output (Vout) of the FET 116 to 0V in the absence of the input from the first power supply 104. In addition, the FET 116 provides internal over voltage protection using the Vbb. The resistors R3, R4, and R5 are used to scale down the supply voltage before providing it to the first circuit 112 for input power availability detection. The diode D3 is used to clamp the voltage.

Similarly to the arrangement of the first path 118, to ensure the leakage current does not provide a false indication to the second circuit 114 that the second power supply 106 is ON, a second FET 120 is included on the second path 122 which provides power from the second power supply 106 to the second circuit 114. The FET 120 is operated as a high-side switch and is operated to bypass the diode leakage current circuit (input side) and second circuit 114.

A divider circuit including resistors R6, R7 is coupled to the input (Vin) of the FET 120 to counter any diode leakage current. The resistor R6 functions as a current limiting resistor. Also, resistor R8 can be selected to aid in limiting the leakage current flow into the Vbb of the FET120. The selection of resistor R8 aids in limiting the output (Vout) of the FET120 to 0V in the absence of the input from the second power supply 106. In addition, the FET 120 provides internal over voltage protection using the Vbb. The resistors R8, R9, and R10 are used to scale down the supply voltage before providing it to the second circuit 114 for input power availability detection. The diode D4 is used to clamp the voltage. In addition, the resistors R6, R8 can provide a moat between the chassis and the signal ground for the battery bus supply from the second power supply 106.

One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

Figure 2:
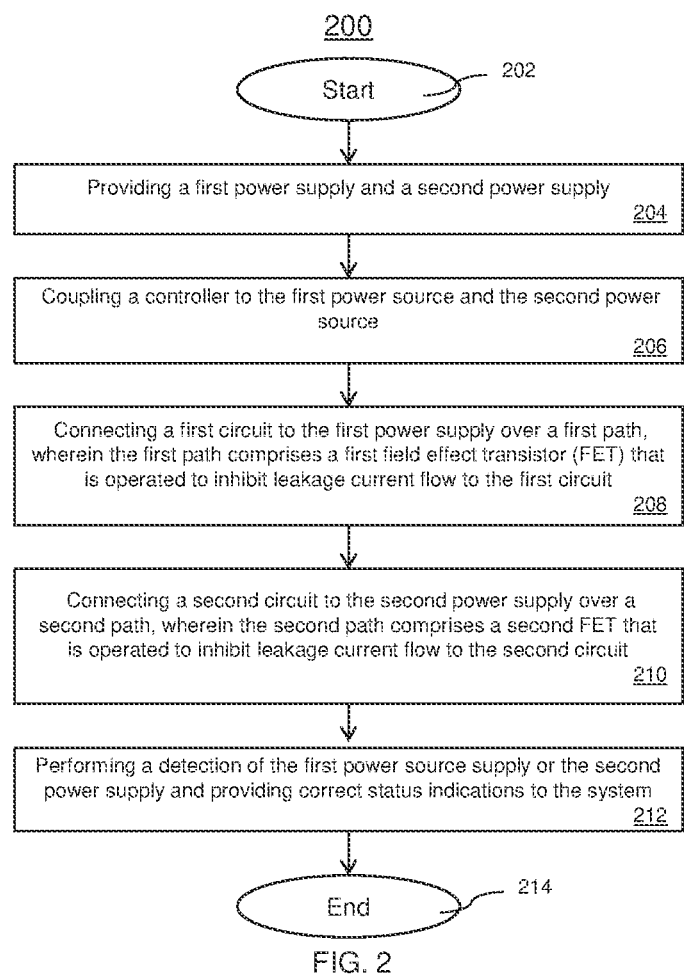
FIG. 2 depicts a method for performing power input source detection in accordance with one or more embodiments of the disclosure.

FIG. 2 depicts a flowchart of a method 200 for performing input power detection in accordance with one or more embodiments of the disclosure. The method 200 can be performed in the system 100 or similar. The method 200 begins in block 202 and proceed to block 204 which provides for providing a first power supply and a second power supply. Block 206 couples a controller to the first power source and the second power source. Block 208 connects a first circuit to the first power supply over a first path, wherein the first path comprises a first field effect transistor (FET) that is operated to inhibit leakage current flow to the first circuit. Block 210 connects a second circuit to the second power supply over a second path, wherein the second path comprises a second FET that is operated to inhibit leakage current flow to the second circuit. Block 212 performs a detection of the first power source supply or the second power supply and providing correct status indications to the system. The correct indication can be provided to the pilot of an aircraft such as that shown in FIG. 3. The method 200 ends at block 214. It is to be understood that different steps or a different sequence of steps can be used, and the method 200 is not intended to be limited by the steps shown in FIG. 2.

One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

Figure 3:
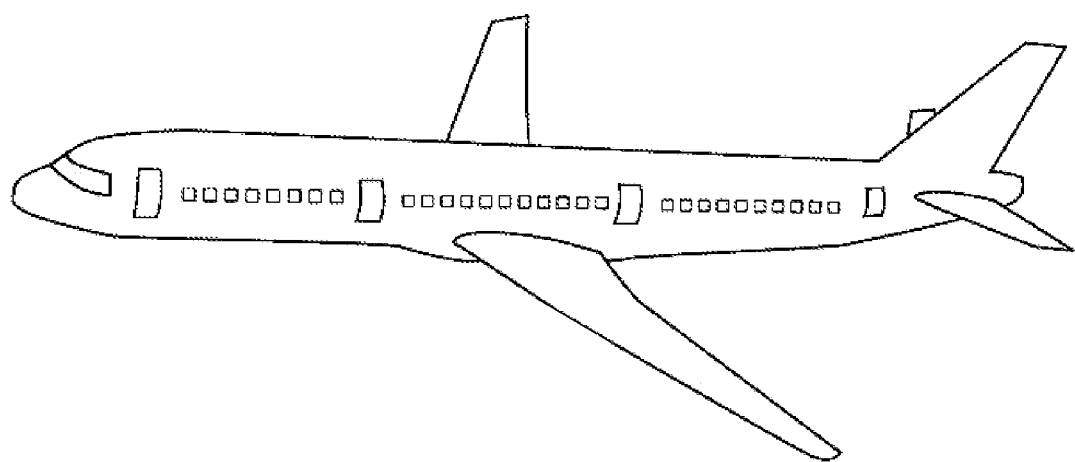
FIG. 3 depicts an aircraft used in accordance with one or more embodiments of the disclosure.

FIG. 3 depicts an example aircraft 300 that can incorporate the input power detection system in accordance with one or more embodiments of the disclosure. Although the proposed system 100 and method 200 are discussed with reference the aircraft 300, it can be appreciated that it can universally applied to any input DC source detection across multiple programs without changing the existing OR'ed dual diodes in designs.

The technical effects and benefits include implementing internal electrostatic discharge (ESD) and over voltage protection feature available using the FET as a switch while eliminating leakage current. Single chip surface mount and small package, no need to change OR'ed diode part. Selection of resistors for the divider network both input and output side will be easy. In addition, the proper input resistor selection reduces the leakage current flow, resulting in increased battery lifetime due to less power consumption when the LRU is driven by only the battery source.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system for performing input power detection comprising:
   a first input for a first power source;
   a second input for a second power source;
   a controller operably coupled to the first power source and the second power source;
   a first path connecting a first circuit to the first power source, wherein the first path comprises a first field effect transistor (FET) that is operated to inhibit leakage current flow to the first circuit; and
   a second path connecting a second circuit to the second power source, wherein the second path comprises a second FET that is operated to inhibit leakage current flow to the second circuit;
   wherein the leakage current is received at the first FET when the first power source is OFF and the second power source is ON.

2. The system of claim 1, wherein the first circuit and the second circuit are configured to detect an availability of the first power source and the second power source, respectively.

3. The system of claim 1, wherein the first power source is 3-phase AC generator, and the second power source is a battery source.

4. The system of claim 1, wherein the leakage current is received at the second FET when the second power source is OFF and the first power source is ON.

5. The system of claim 1, wherein the controller is coupled to the first power source and the second power source using an OR'ed diode configuration.

6. The system of claim 1, wherein the first FET and the second FET are arranged as high-side switches.

7. The system of claim 1, wherein the first FET and the second FET provide overvoltage protection.

8. A method for performing input power detection, the method comprising:
   providing a first power source;
   providing a second power source;
   coupling a controller to the first power source and the second power source;
   connecting a first circuit to the first power source over a first path, wherein the first path comprises a first field effect transistor (FET) that is operated to inhibit leakage current flow to the first circuit; and
   connecting a second circuit to the second power source over a second path, wherein the second path comprises a second FET that is operated to inhibit leakage current flow to the second circuit; and receiving the leakage current at the second FET when the second power source is OFF and the first power source is ON.

9. The method of claim 8, wherein the first circuit and the second circuit are configured to detect an availability of the first power source and the second power source, respectively.

10. The method of claim 8, wherein the first power source is 3-phase AC generator, and the second power source is a battery source.

11. The method of claim 8, further comprising receiving the leakage current at the first FET when the first power source is OFF and the second power source is ON.

12. The method of claim 8, further comprising coupling the first power source and the second power source to the controller using an OR'ed diode configuration.

13. The method of claim 8, wherein the first FET and the second FET are arranged as high-side switches.

14. The method of claim 8, wherein the first FET and the second FET provide overvoltage protection.

* * * * *